US010153203B2

(12) United States Patent
Wang et al.

(10) Patent No.: US 10,153,203 B2
(45) Date of Patent: Dec. 11, 2018

(54) METHODS FOR FORMING METAL LAYERS IN OPENINGS AND APPARATUS FOR FORMING SAME

(71) Applicant: Taiwan Semiconductor Manufacturing Company, Ltd., Hsinchu (TW)

(72) Inventors: Yu-Sheng Wang, Tainan (TW); Yu-Ting Lin, Tainan (TW); Hung-Chang Hsu, Kaohsiung (TW); Hsiao-Ping Liu, Hsinchu (TW); Hung Pin Lu, Hsinchu (TW); Yuan Wen Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/665,957

(22) Filed: Aug. 1, 2017

(65) Prior Publication Data

US 2018/0151429 A1 May 31, 2018

Related U.S. Application Data

(60) Provisional application No. 62/427,457, filed on Nov. 29, 2016.

(51) Int. Cl.
*H01L 21/768* (2006.01)
*H01L 21/285* (2006.01)

(52) U.S. Cl.
CPC .... *H01L 21/76889* (2013.01); *H01L 21/2855* (2013.01); *H01L 21/28518* (2013.01); *H01L 21/28568* (2013.01); *H01L 21/76805* (2013.01); *H01L 21/76816* (2013.01); *H01L 21/76831* (2013.01); *H01L 21/76849* (2013.01); *H01L 21/76895* (2013.01)

(58) Field of Classification Search
CPC ......... H01L 21/76889; H01L 21/28518; H01L 21/2855; H01L 21/28568; H01L 21/76805; H01L 21/76816; H01L 21/76831; H01L 21/76849; H01L 21/76895
See application file for complete search history.

(56) References Cited

U.S. PATENT DOCUMENTS

2005/0083750 A1* 4/2005 Sakagami ............ H01L 27/115 365/222
2007/0051617 A1* 3/2007 White ................. H01J 37/3408 204/192.1
2010/0252417 A1 10/2010 Allen et al.
(Continued)

*Primary Examiner* — Karen Kusumakar
(74) *Attorney, Agent, or Firm* — Slater Matsil, LLP

(57) ABSTRACT

A method includes forming an Inter-layer Dielectric (ILD) having a portion at a same level as a metal gate of a transistor. The ILD and the metal gate are parts of a wafer. The ILD is etched to form a contact opening. The wafer is placed into a PVD tool, with a metal target in the PVD tool. The metal target has a first spacing from a magnet over the metal target, and a second spacing from the wafer. A ratio of the first spacing to the second spacing is greater than about 0.02. A metal layer is deposited on the wafer, with the metal layer having a bottom portion in the contact opening, and a sidewall portion in the contact opening. An anneal is performed to react the bottom portion of the metal layer with the source/drain region to form a silicide region.

20 Claims, 13 Drawing Sheets

(56) References Cited

U.S. PATENT DOCUMENTS

2012/0018797 A1* 1/2012 Yu ..................... H01L 21/28518 257/324
2013/0049219 A1 2/2013 Tsai et al.
2013/0299937 A1* 11/2013 Ahmed ................... H01L 29/47 257/475
2016/0043035 A1 2/2016 Lin et al.
2016/0133721 A1* 5/2016 Cai ..................... H01L 29/4958 257/506
2017/0062344 A1* 3/2017 Liu ................... H01L 23/53238

* cited by examiner 10
72
70
66
62
36
34
22
20
76
74
60
28
24
26B
30
56
44
50
22
75
77
26A

METHODS FOR FORMING METAL LAYERS IN OPENINGS AND APPARATUS FOR FORMING SAME

PRIORITY CLAIM AND CROSS-REFERENCE

This application claims the benefit of the following provisionally filed U.S. Patent application: Application Ser. No. 62/427,457, filed Nov. 29, 2016, and entitled "Methods for Forming Metal Layers in Openings and Apparatus for Forming Same," which application is hereby incorporated herein by reference.

BACKGROUND

In the manufacturing of integrated circuits, contact plugs are used for connecting to the source and drain regions and the gates of transistors. The source/drain contact plugs are typically connected to source/drain silicide regions, which are formed by depositing a metal layer, and then performing an anneal to react the metal layer with the silicon of the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
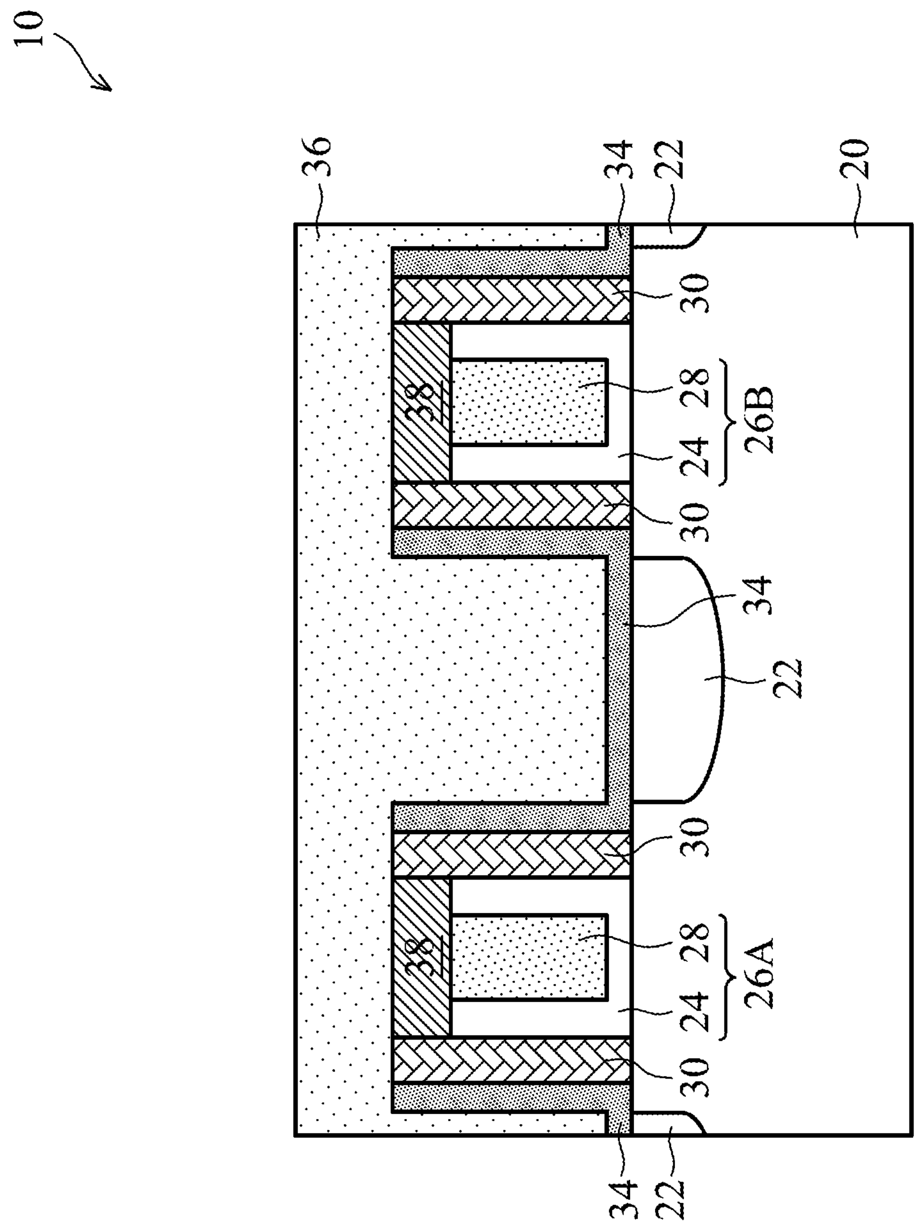
FIGS. 1 through 11 are cross-sectional views of intermediate stages in the formation of a transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor having contact plugs connected to silicide regions and the method of forming the same are provided in accordance with various exemplary embodiments. The intermediate stages of forming the transistor are illustrated. The variations of some embodiments are discussed. Throughout the various views and illustrative embodiments, like reference numbers are used to designate like elements. The steps shown in FIGS. 1 through 11 are also illustrated schematically in the process flow 200 shown in FIG. 13.

FIGS. 1 through 11 are cross-sectional views of intermediate stages in the formation of a transistor and the respective contact plugs in accordance with some exemplary embodiments. Referring to FIG. 1, wafer 10 is provided. Wafer 10 includes substrate 20, which may be formed of a semiconductor material such as silicon, silicon germanium, silicon carbon, III-V compound semiconductor materials, or the like. Substrate 20 may be a bulk substrate or a Semiconductor-On-Insulator (SOI) substrate.

Gate stacks 26A and 26B, which are collectively referred to as gate stacks 26, are formed over substrate 20. In accordance with some embodiments of the present disclosure, gate stacks 26A and 26B are formed as gate stack strips (in a top view of wafer 10) having lengthwise directions parallel to each other, wherein the distance between gate stacks 26A and 26B is minimized. Each of gate stacks 26A and 26B may include gate dielectric 24, gate electrode 28 over gate dielectric 24, and hard mask 38 over gate electrode 28. In accordance with some embodiments of the present disclosure, gate stacks 26 are replacement gate stacks, which are formed by forming dummy gate stacks (not shown), removing the dummy gate stacks to form recesses, and forming the replacement gates in the recesses. As a result, each of gate dielectrics 24 includes a bottom portion underlying the respective gate electrode 28, and sidewall portions on the sidewalls of the respective gate electrode 28. The sidewall portions form rings encircling the respective gate electrodes 28.

Figure 2:
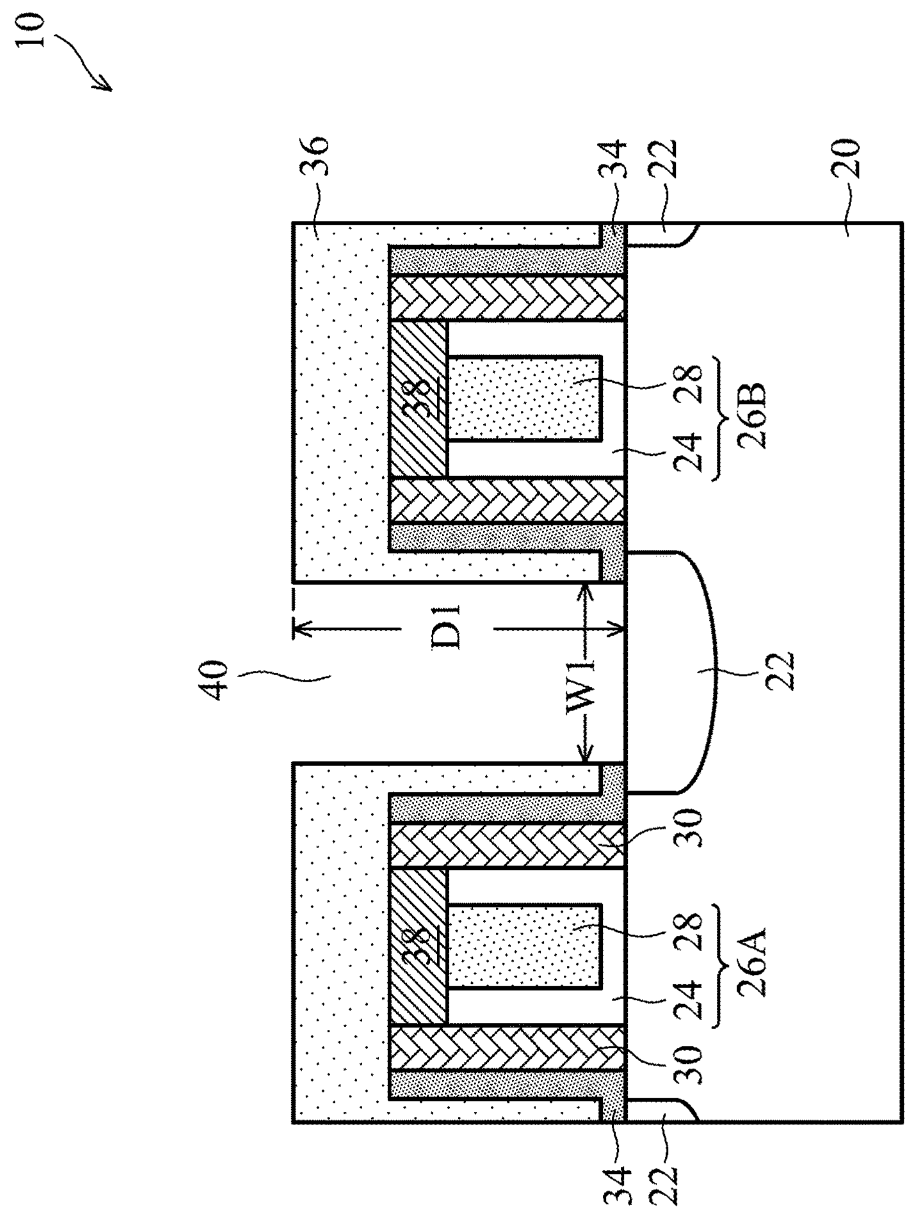

In accordance with some embodiments of the present disclosure, source and drain regions 22 (referred to as source/drain regions 22 hereinafter) are formed to extend into substrate 20. In accordance with alternative embodiments, source/drain regions 22 are formed after the formation of contact opening as shown in FIG. 2. One of source/drain regions 22 may be a common source region or a common drain region shared by gate stacks 26A and 26B. Accordingly, gate stack 26A may form a first transistor along with the source/drain regions on the opposite sides of gate stack 26A, and gate stack 26B may form a second transistor along with the source/drain regions on the opposite sides of gate stack 26B. The first transistor and the second transistor may be electrically connected in parallel to act as a single transistor.

Gate dielectric 24 may be a single layer or a composite layer that includes a plurality of layers. For example, gate dielectric 24 may include an interfacial oxide layer and a high-k dielectric layer over the oxide layer. The oxide layer may be a silicon oxide layer formed through thermal oxidation or chemical oxidation. The high-k dielectric layer may have a k value greater than 7, or even greater than 20. Exemplary high-k dielectric materials include hafnium oxide, zirconium oxide, lanthanum oxide, and the like.

In accordance with some embodiments of the present disclosure, each gate electrode 28 has a single-layer structure formed of a homogeneous conductive material. In accordance with alternative embodiments, each gate electrode 28 has a composite structure including a plurality of layers formed of TiN, TaSiN, WN, TiAl, TiAlN, TaC, TaN, aluminum, or alloys thereof. The formation of gate electrodes 28 may include Physical Vapor Deposition (PVD), Metal-Organic Chemical Vapor Deposition (MOCVD), and/or other applicable methods. Hard masks 38 may be formed of silicon nitride, for example.

In accordance with alternative embodiments of the present disclosure, rather than being replacement gate stacks, gate stacks 26A and 26B are formed by forming a blanket gate dielectric layer and a blanket gate electrode layer (such as a polysilicon layer), and then patterning the blanket gate dielectric layer and the blanket gate electrode layer.

Referring again to FIG. 1, Contact Etch Stop Layer (CESL) 34 is formed to cover substrate 20, and may extend on the sidewalls of gate spacers 30. In accordance with some embodiments of the present disclosure, CESL 34 comprises silicon nitride, silicon carbide, or other dielectric materials. Inter-Layer Dielectric (ILD) 36 is formed over CESL and gate stacks 26A and 26B. ILD 36 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like.

Referring to FIG. 2, ILD 36 and CESL 34 are etched to form contact opening 40. The respective step is illustrated as step 202 in the process flow shown in FIG. 13. Opening 40 is a source/drain contact opening in accordance with some embodiments. Source/drain region 22 (if already formed) is exposed to contact opening 40. In accordance with some embodiments of the present disclosure, opening 40 has width W1 smaller than about 40 nm. Depth D1 may be greater than about 100 nm. Accordingly, opening 40 has a high aspect ratio.

In accordance with the embodiments in which source/drain regions 22 have not been formed yet at this time, a Pre-Amorphization Implantation (PAI) and a source/drain implantation may be performed to form source/drain regions 22, wherein the species of the PAI and the implanted impurity for forming source/drain regions 22 are implanted into substrate 20 through opening 40. The PAI may be performed using germanium, silicon, or the like, which destroys the lattice structure of the implanted regions in order to control the depth of the subsequent source/drain implantation. The source/drain implantation may be performed using boron or indium if the respective transistor is a p-type transistor, or using phosphorous, arsenic, or antimony if the respective transistor is an n-type transistor.

Figure 3:
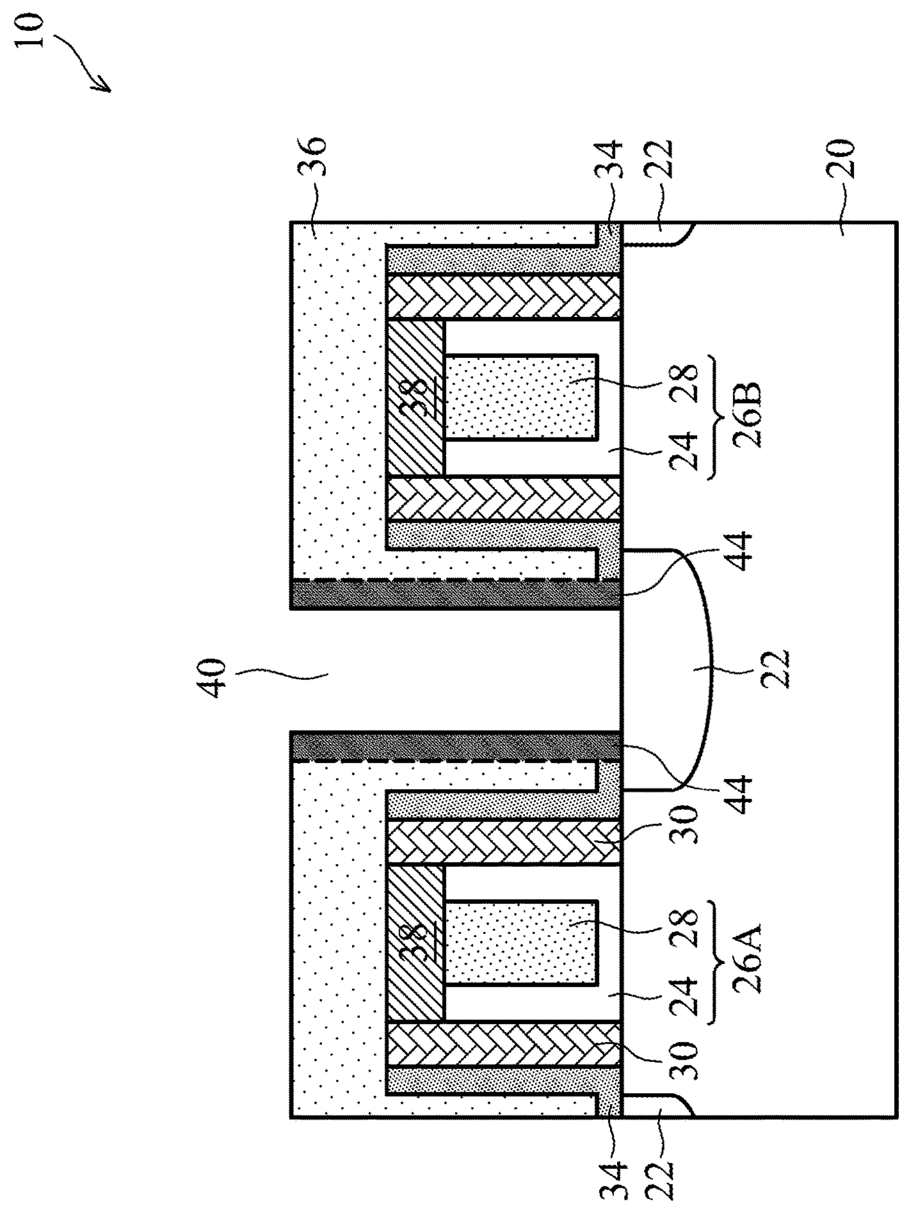

FIG. 3 illustrates the formation of contact (plug) spacers 44 in accordance with some embodiments of the present disclosure. The respective step is illustrated as step 204 in the process flow shown in FIG. 13. The formation of contact spacers 44 may include depositing one or a plurality of conformal dielectric layer(s). The dielectric layer extend into contact opening 40, and includes vertical portions on the sidewalls of ILD 36, and horizontal portions at the bottom of opening 40 as well as over ILD 36. The deposition process is performed using a conformal deposition process such as Atomic Layer Deposition (ALD), CVD, or the like, so that the horizontal portions and vertical portions of the deposited layer have similar thicknesses. An anisotropic etching is then performed to remove the horizontal portions, leaving the vertical portions as contact spacers 44. The anisotropic etching may be performed using ammonia ($NH_3$) and $NF_3$ as etching gases. It is noted that contact spacers 44 of the same opening 40, when viewed in a top view of wafer 10, are portions of an integrated spacer ring.

In accordance with some embodiments of the present disclosure, spacers 44 are formed of a dielectric material that has a high etching selectivity relative to oxide, so that in subsequent cleaning processes (in which oxides are removed), the spacers are not damaged. For example, contact spacers 44 may be formed of silicon nitride, silicon oxy-carbide, silicon oxynitride, or the like.

Figure 13:
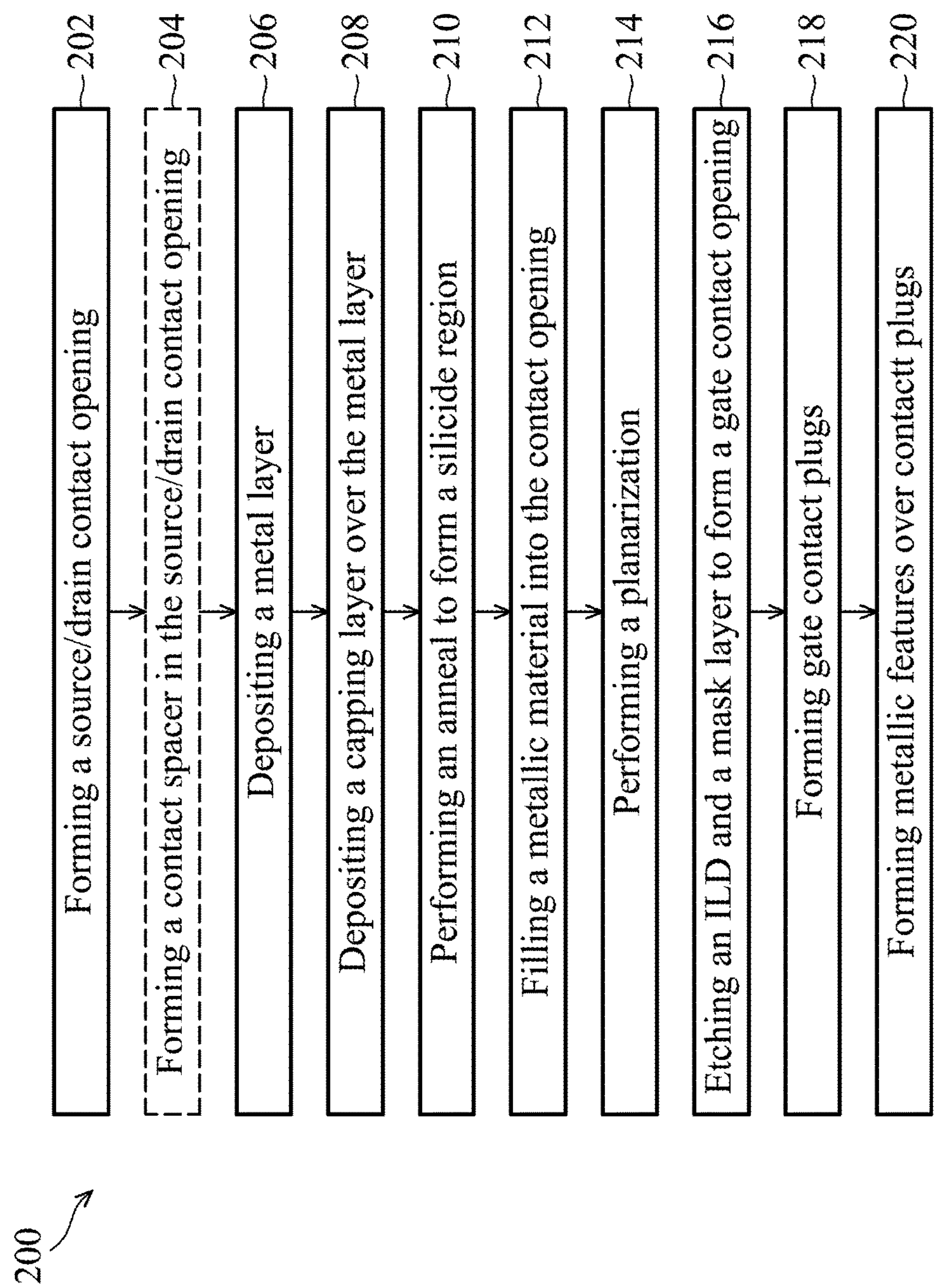
FIG. 13 illustrates a process flow for forming a transistor in accordance with some embodiments.

In accordance with alternative embodiments of the present disclosure, spacers 44 are not formed. Accordingly, the step 204 in FIG. 13 is shown with a dashed box to indicate this step may be performed or skipped. In accordance with these embodiments, the subsequently formed metal layer 46 (FIG. 4) may have sidewall portions in contact with the sidewalls of ILD 36.

Figure 4:
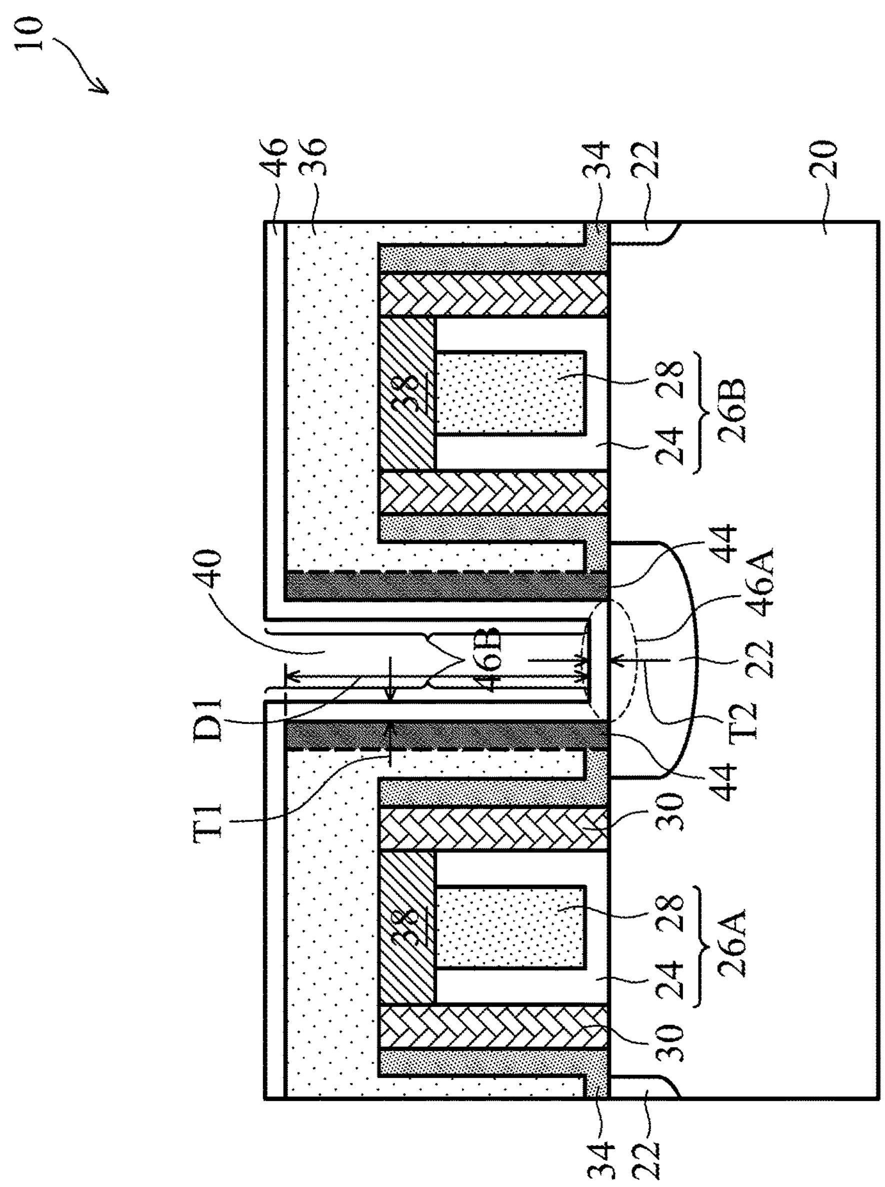

Next, referring to FIG. 4, metal layer 46 is deposited. The respective step is illustrated as step 206 in the process flow shown in FIG. 13. In accordance with some embodiments of the present disclosure, metal layer 46 is a titanium (Ti) layer, which may be formed using Physical Vapor Deposition (PVD). Metal layer 46 includes bottom portion 46A at the bottom of opening 40, and sidewall portions 46B on the sidewall surfaces of ILD 36. Sidewall portions 46B have sidewall thickness T1, and bottom portion 46A has bottom thickness T2. Sidewall thickness T1 may be measured at a height equal to ⅔ of depth D1 of opening 40. Ratio T1/T2 may be smaller than about 0.35, and may be in the range between about 0.26 and about 0.34. Metal layer 46 has two functions. The first function is that the bottom portion of metal layer 46 reacts with the underlying source/drain region 22 to form a source/drain silicide region. Accordingly, it is desirable that thickness T2 has a great value, so that the contact resistance between the resulting silicide region and the overlying contact plug is low. The second function is that metal layer 46 acts as an adhesion layer for the subsequently formed capping/adhesion layer. Accordingly, the sidewall thickness T1 preferably has a value greater than zero. Thickness T1, on the other hand, cannot have a great value since this will cause the upper portion of contact opening 40 to be too narrow, resulting in a seam (defect) in the subsequently formed contact plug. Accordingly, to reduce the contact resistance without causing the defect, bottom thickness T2 is increased, and sidewall thickness T1 is reduced to a small (but none zero) value in accordance with some embodiments. Furthermore, the sidewall portions 46B may have a uniform thickness in accordance with some embodiments of the present disclosure.

Figure 12:
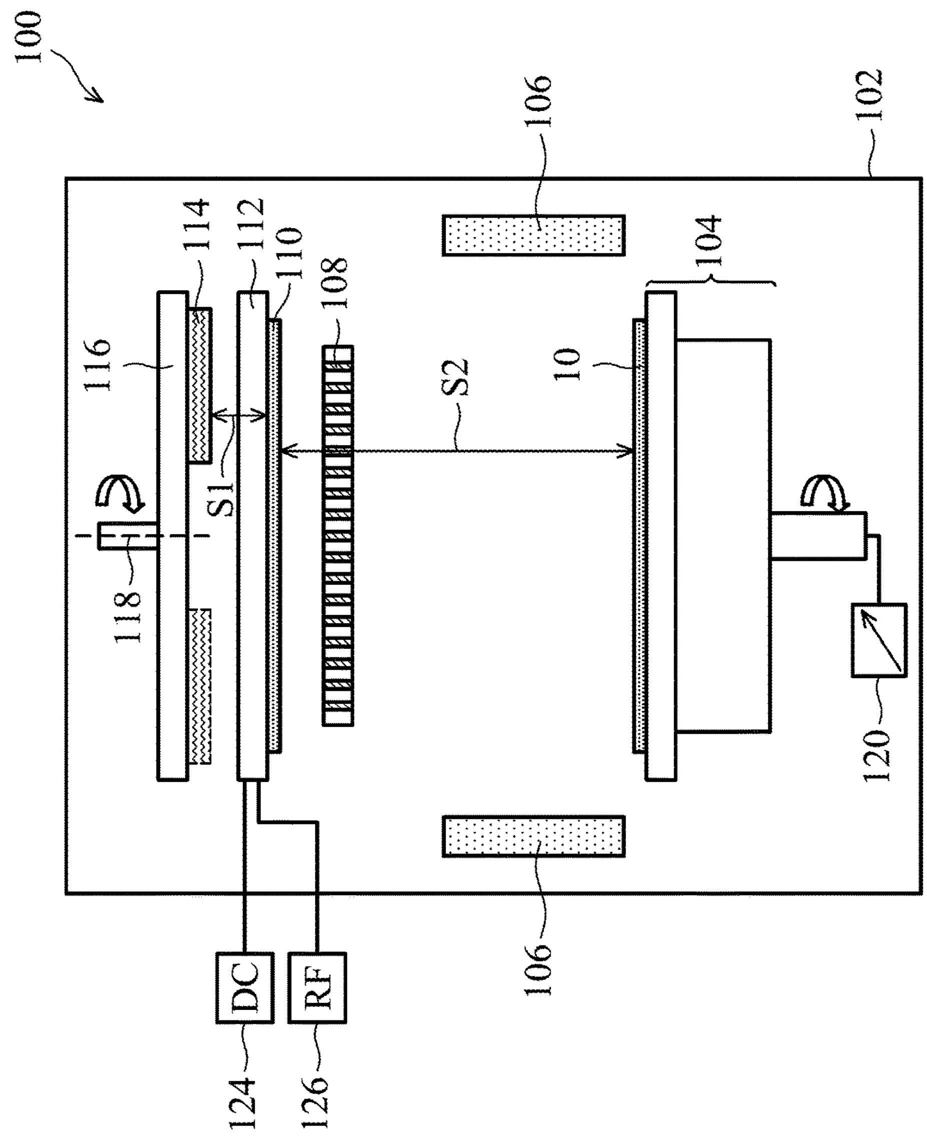
FIG. 12 illustrates a cross-sectional view of a chamber for physical Vapor deposition in accordance with some embodiments.

With the width W1 (FIG. 2) of opening 40 being very small, it is difficult to increase the bottom thickness T2, for example, to greater than about 5 nm, particularly greater than about 9 nm. Accordingly, a PVD tool is designed and configured to achieve such a goal. FIG. 12 illustrates PVD tool 100 in accordance with some embodiments of the present disclosure. PVD tool 100 includes vacuum chamber 102. Chuck 104, electromagnetic coil 106, collimator 108, target 110, target cover plate 112, and magnet 114 are located in vacuum chamber 102.

Wafer 10 (which is also shown in FIG. 3) is placed on and secured by chuck 104 in order to form metal layer 46 (FIG. 4). Target 110 is formed of the metal that is to be deposited, and may be a titanium target, for example. Target 110 is mounted on the overlying target cover plate 112. Magnet 114 is disposed over target cover plate 112. Magnet 114 may be mounted on plate 116. Plate 116 is configured to be rotated around vertical axis 118 that is aligned to the center of target 110 and wafer 10. Magnet 114 may include one piece or a plurality of pieces, each located on one side of axis 118. During the deposition, magnet 114 is rotated around axis 118. A magnet is illustrated using dashed line to show the location it can rotate to.

Target no is spaced apart from magnet 114 by spacing S1, and is spaced apart from wafer by spacing S2. In order to increase the bottom thickness T2 (FIG. 4) of metal layer 46, spacing S2 is reduced. However, this may cause the whole-wafer-uniformity in the thickness of metal layer 46 throughout wafer 10 to be non-uniform. For example, the thicknesses of metal layer 46 at the edge of wafer 10 and at the center of wafer 10 may have an increased difference due to the reduction of spacing S2. Spacing S1 is thus adjusted and increased to reduce the non-uniformity in the thickness of metal layer 46. In accordance with some embodiments of the present disclosure, the reduction of increase in spacing S1 includes adjusting the location of magnet 114 to be higher, which may be achieved through hardware change and adjustment, for example, the change and the adjustment of the positions of the mounting mechanism of magnet 114. In accordance with alternative embodiments, a hardware adjustment is performed to move down target no to reduce spacing S2 and increase spacing S1. Magnet 114 may also be moved in addition to the adjustment of the height of target no.

Experiment results reveals that when ratio S1/S2 is greater than about 0.02, by optimizing process conditions, the through-wafer uniformity and thicknesses of metal layer 46 may be satisfactory, and may be brought within specification. Ratio S1/S2 may be in the range between about 0.02 and about 0.03. In accordance with some embodiments of the present disclosure, with ratio S1/S2 being greater than about 0.02, spacing S1 may be in the range between about 3.7 mm and about 3.9 mm, and spacing S2 may be in the range between about 184 mm and about 186 mm.

Thicknesses T1 and T2 are also affected by various process conditions. In accordance with some embodiments of the present disclosure, some process conditions are adjusted to achieve the desirable thicknesses T1 and T2. For example, in the deposition of metal layer 46, argon may be used as the process gas. The flow rate of the process gas is increased to increase the deposition rate, and to increase the ratio T2/T1 (so that bottom thickness T2 is greater without increasing sidewall thickness T1). The flow rate may be greater than about 160 sccm, and may be in the range between about 160 sccm and about 200 sccm. The pressure of the process may also be increased in order to increase the ratio T2/T1. For example, in the deposition of metal layer 46, the pressure in chamber 102 (FIG. 12) may be greater than about 80 mTorr, and may be in the range between about 80 mTorr and about 120 mTorr.

Additional process conditions affecting the thicknesses T1 and T2 include the RF power 126 connected to target cover plate 112, the DC power 124 connected to target cover plate 112, and the Auto Capacity Tuner (ACT) 120 current provided to chuck 104. In accordance with some embodiments of the present disclosure, the RF power 126 is lower than about 5 KW, and may be in the range between about 1,200 watts and about 2,100 watts (at the frequency of 13.5 MHz, for example). The DC power 124 is lower than about 1.5 KW, and may be in the range between about 50 watts and about 800 watts.

Through the hardware adjustment to tune ratio S1/S2, and through the tuning of process conditions in the deposition, metal layer 46 (FIG. 4) may have an increased bottom thickness T2 without increasing thickness T1, even if metal layer 46 is deposited into very small opening 40 (with width W1 smaller than about 40 nm, for example). Experiment results revealed that when the bottom thickness T2 is about 8 nm or smaller, the subsequently formed contact plug 56 (FIG. 8 will have seam. Conversely, when the bottom thickness T2 is about 9.5 nm or greater, the subsequently formed contact plug 56 (FIG. 8) will not have seam. Accordingly, in accordance with some embodiments of the present disclosure, thickness T2 is greater than about 9.5 nm when the width W1 of opening is smaller than about 40 nm. Thickness ratio T1/T2 may be smaller than about 0.35, and may be in the range between about 0.26 and about 0.34.

Figure 5:
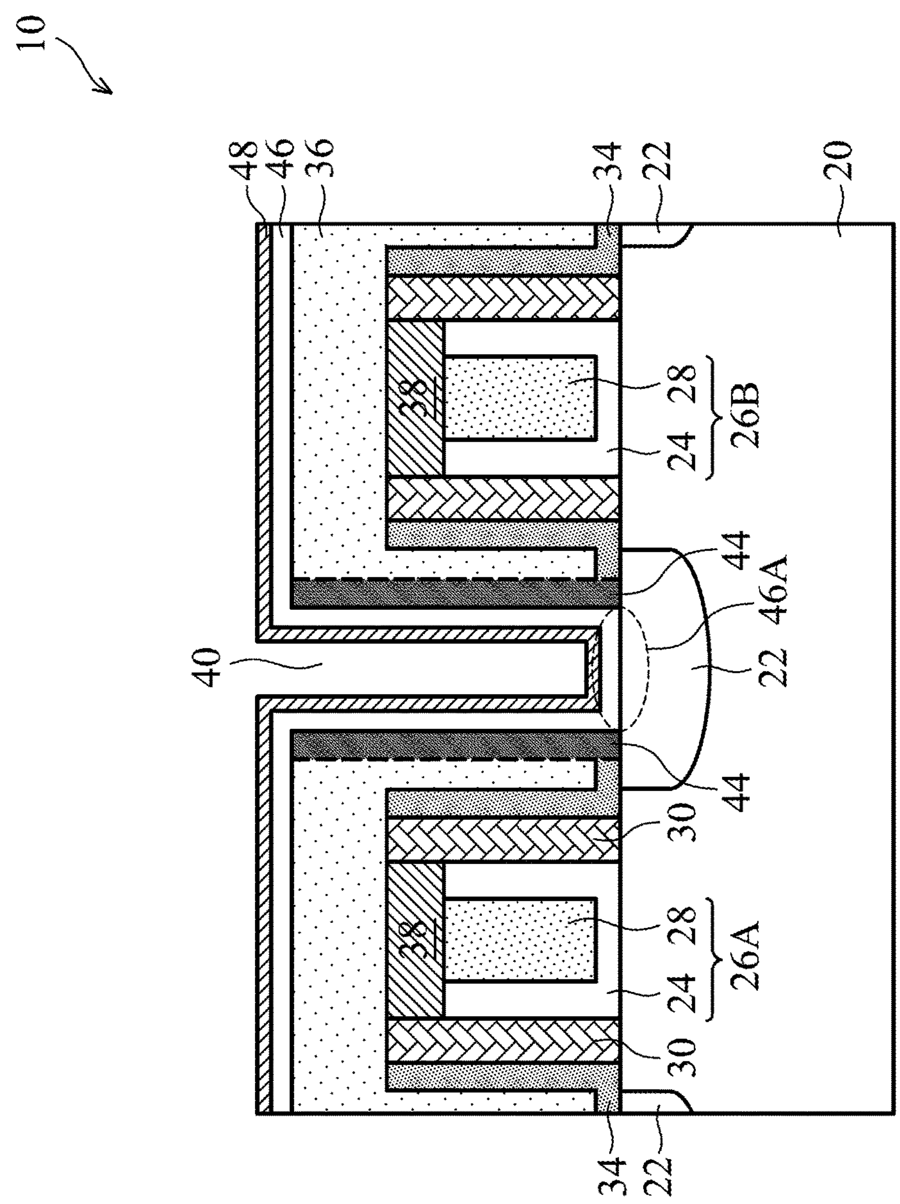

Referring to FIG. 5, capping layer 48 is deposited. The respective step is illustrated as step 208 in the process flow shown in FIG. 13. Capping layer 48 also acts as a diffusion barrier layer. In accordance with some embodiments of the present disclosure, capping layer 48 is formed of a metal nitride such as titanium nitride. Capping layer 48 may be formed using CVD, which may be formed in a CVD chamber. Accordingly, wafer 10 may be removed from the PVD chamber 102 (FIG. 12), and placed in the CVD chamber for forming capping layer 48. Capping layer 48 may be a conformal layer with the horizontal thickness and vertical thickness being close to each other. In accordance with alternative embodiments, capping layer 48 is formed in the same chamber 102, with additional nitrogen gas introduced when the metal is sputtered from target 110.

Figure 6:
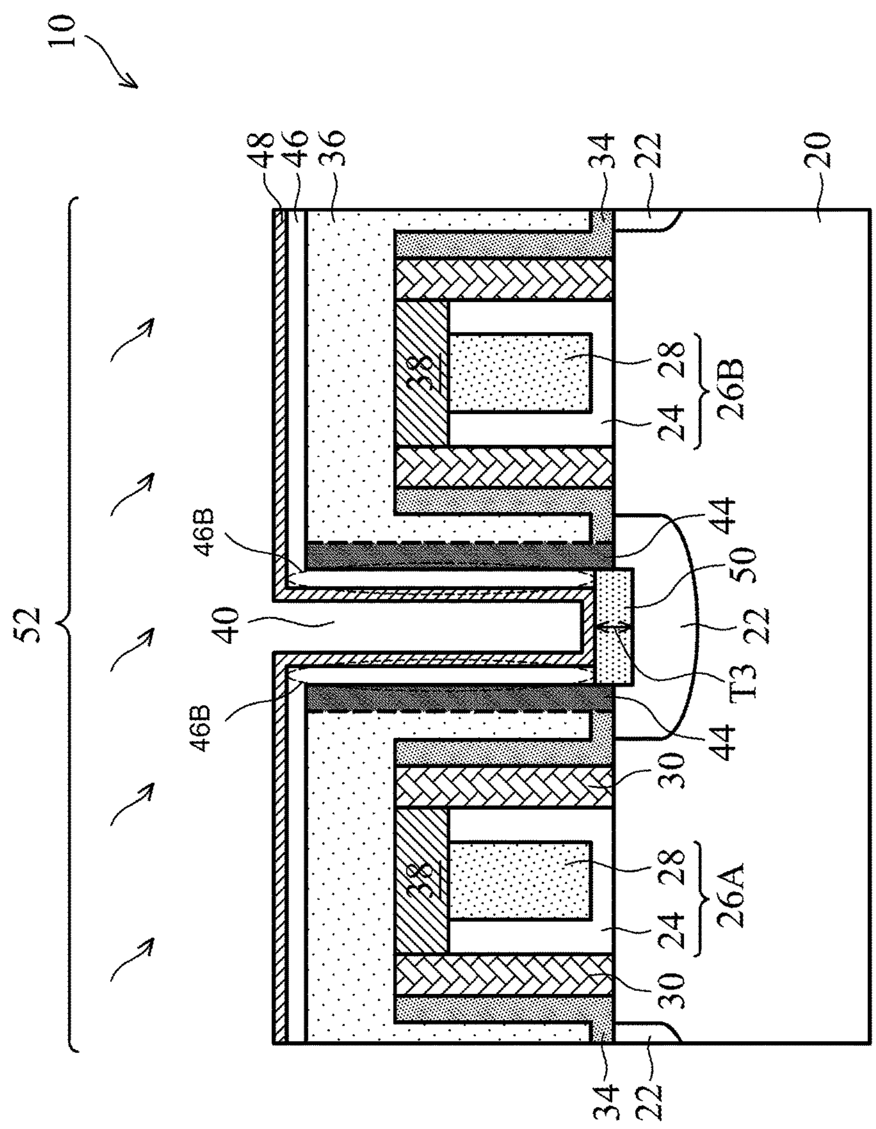

FIG. 6 illustrates a silicidation process for forming silicide region 50. In accordance with some embodiments of the present disclosure, the silicidation process is performed through an anneal, which is represented by arrows 52. The respective step is illustrated as step 210 in the process flow shown in FIG. 13. The anneal may be performed through Rapid Thermal Anneal (RTA), furnace anneal, or the like. Accordingly, the bottom portion 46A (FIG. 5) of metal layer 46 reacts with source/drain region 22 to form silicide region 50. Sidewall portions 46B remain after the silicidation process, as shown in FIG. 6. In accordance with some embodiments of the present disclosure, bottom portion 46A (FIG. 5) is fully reacted, and the top surface of silicide region 50 is in contact with the bottom surface of capping layer 48. After the silicidation, ratio T1/T3 is smaller than about 0.35, wherein thickness $T_3$ is the thickness of silicide region 50.

Figure 7:
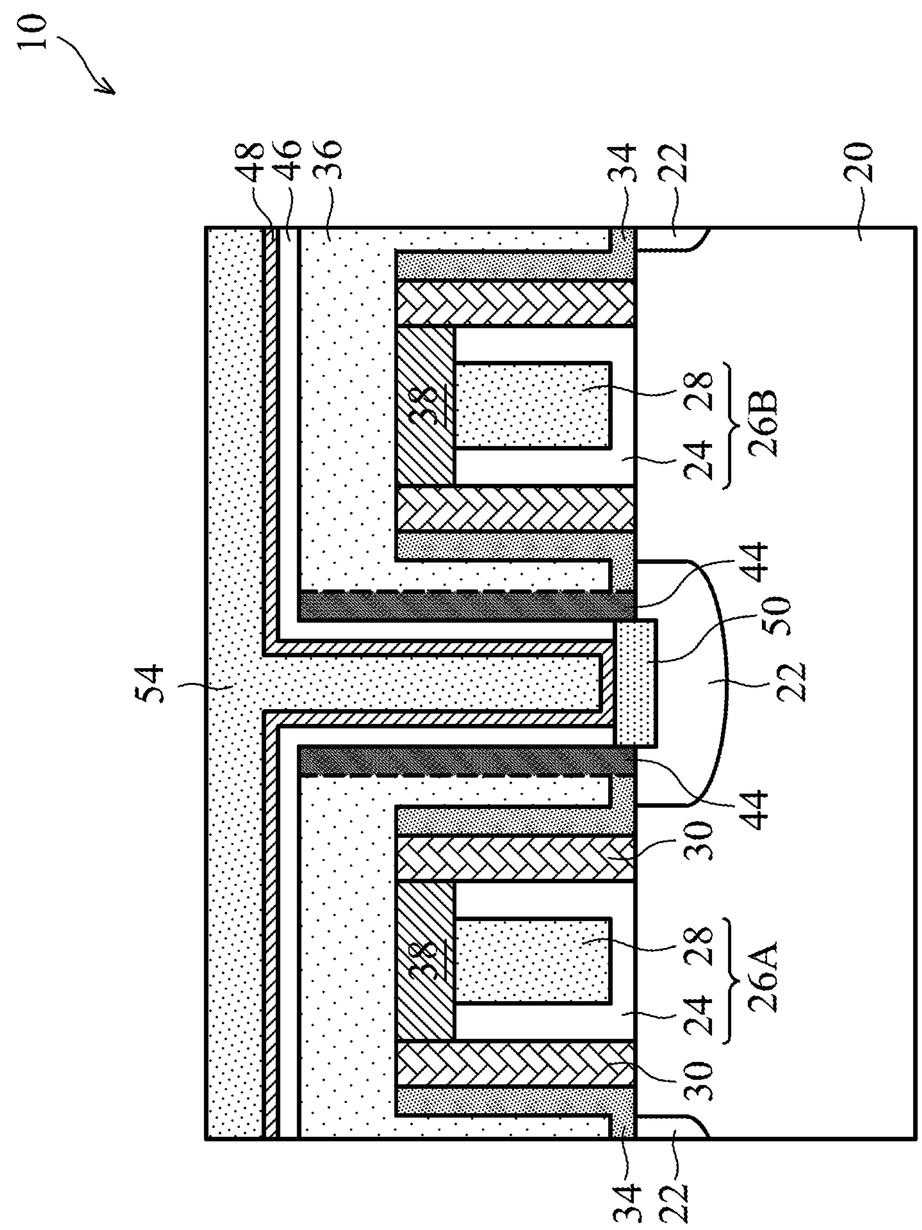
Figure 8:
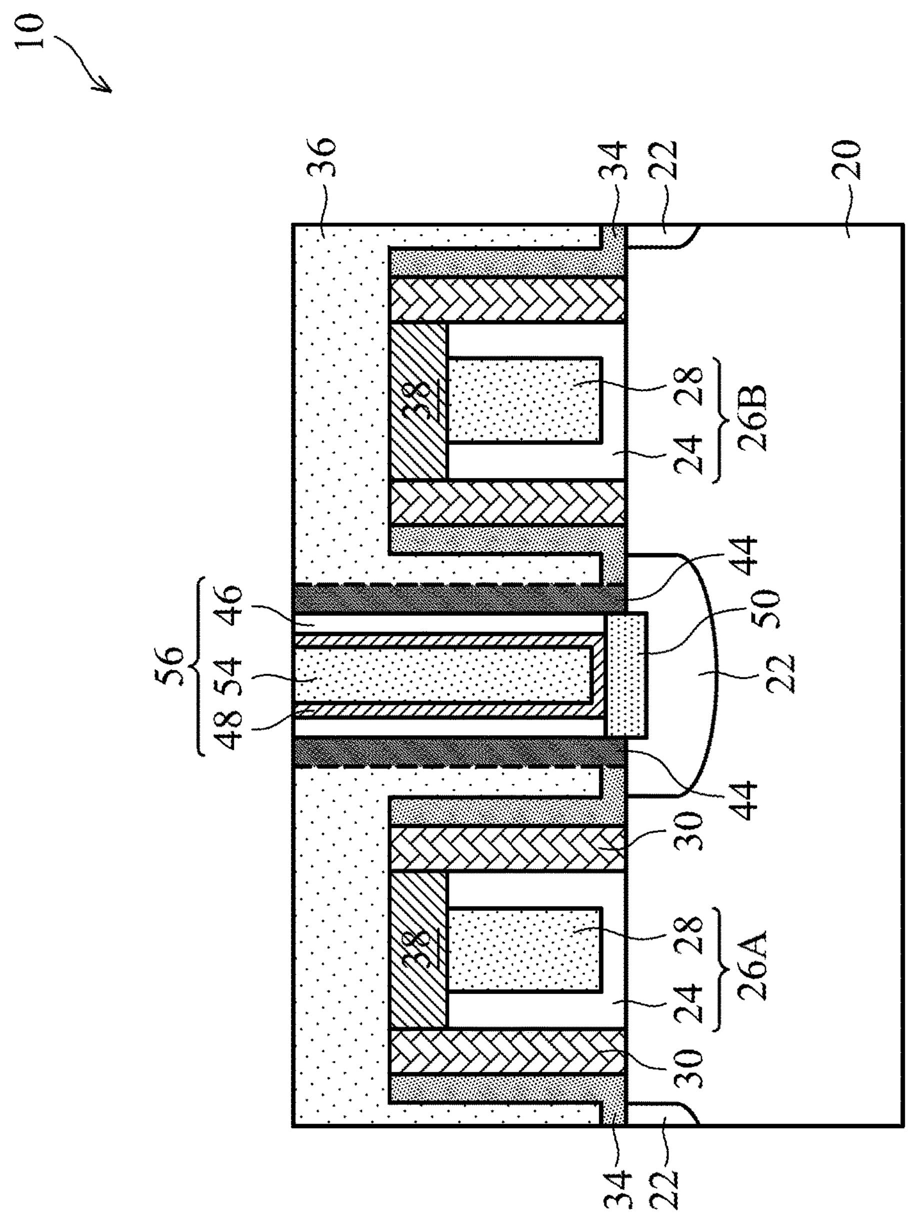

Next, metallic material 54 is filled into the remaining contact opening 40, and the resulting wafer 10 is shown in FIG. 7. The respective step is illustrated as step 212 in the process flow shown in FIG. 13. Metallic material 54 may be formed of tungsten, copper, aluminum, or a metal alloy, for example. Next, a planarization process such as a Chemical Mechanical Polish (CMP) is performed to remove the excess portions of metallic material 54, capping layer 48, and metal layer 46 over ILD 36. The respective step is illustrated as step 214 in the process flow shown in FIG. 13. Source/drain contact plug 56 is thus formed, as shown in FIG. 8.

Figure 9:
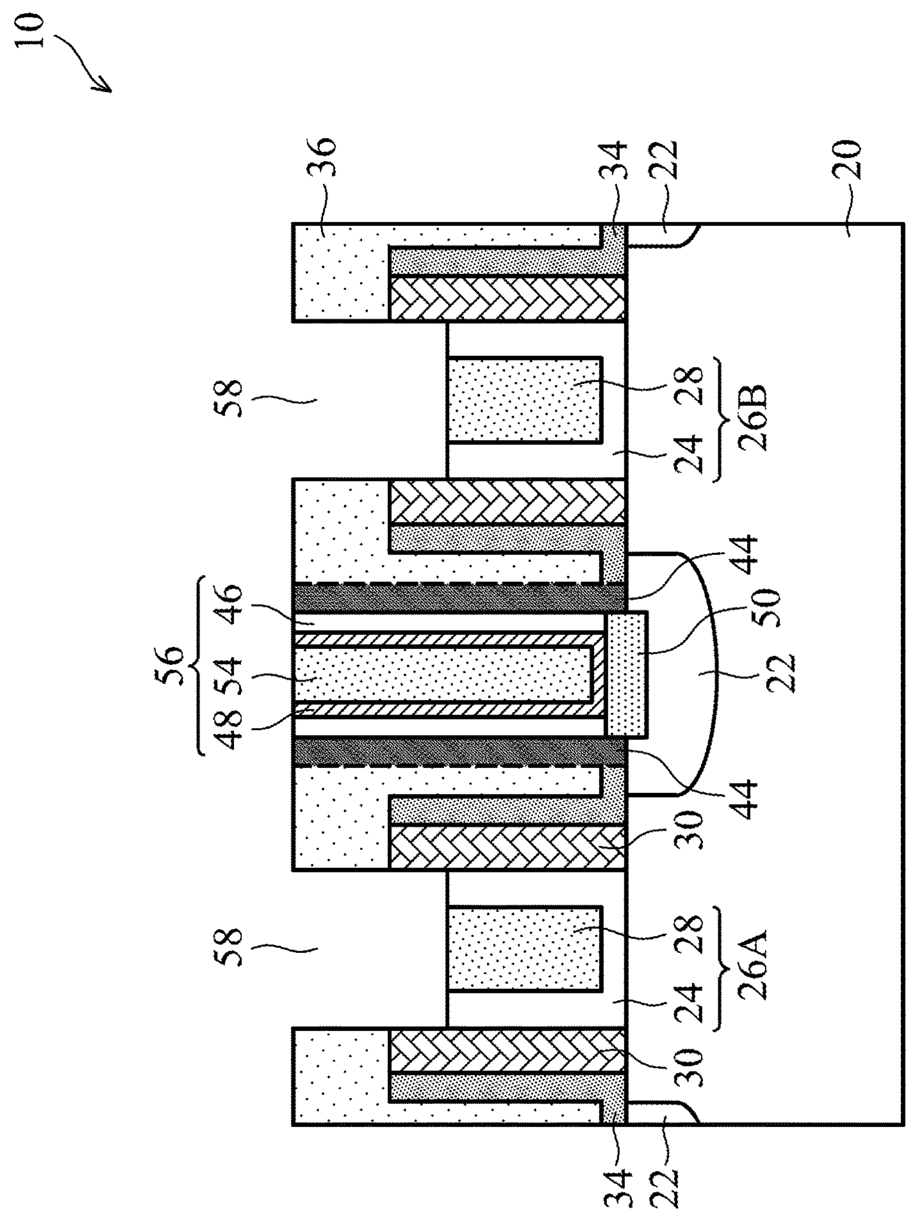
Figure 10:
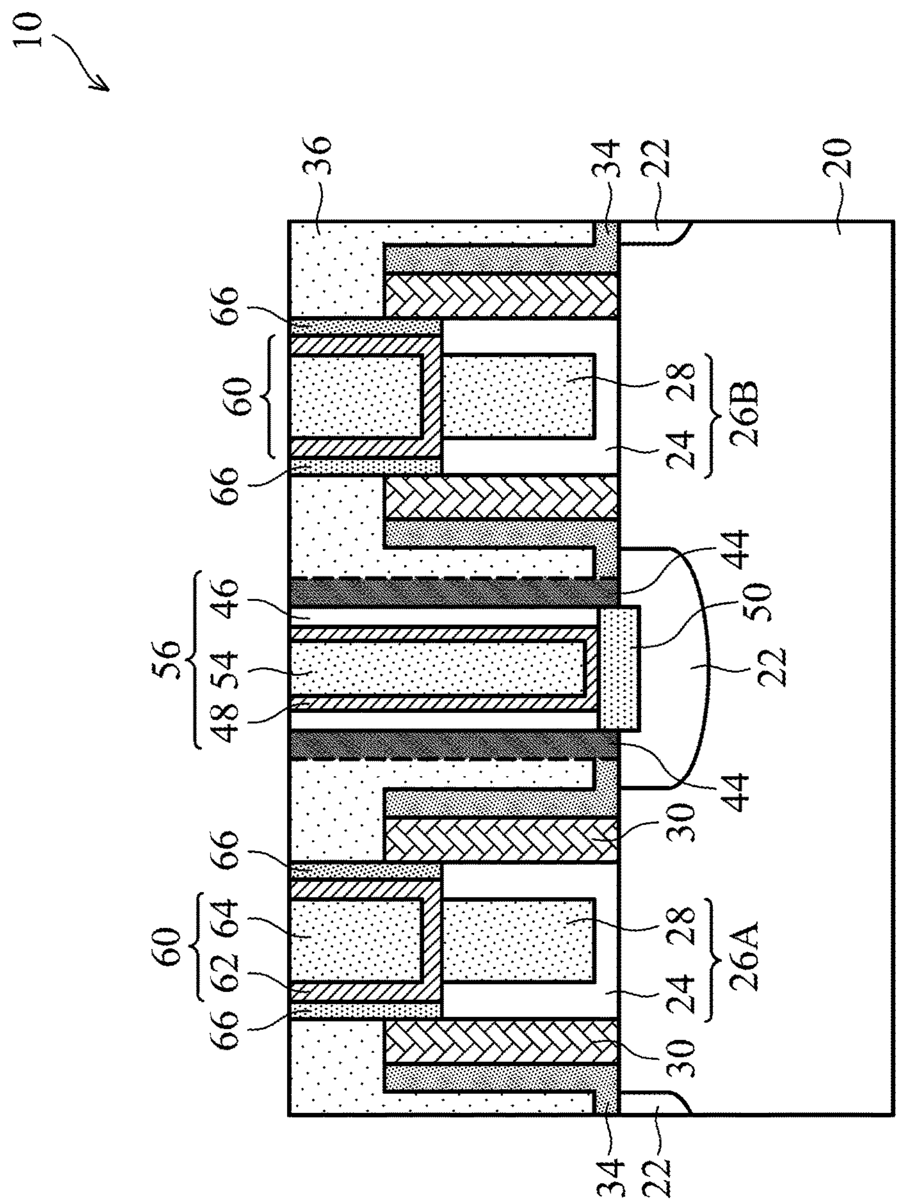

FIGS. 9 and 10 illustrate the formation of gate contact plugs. An etching process(es) is performed to etch ILD 36 and mask layers 38 (FIG. 8), so that openings 58 are formed, as shown in FIG. 9. The respective step is illustrated as step 216 in the process flow shown in FIG. 13.

Next, contact openings 58 are filled with a conductive material(s) to form gate contact plugs 60, as shown in FIG. 10. The respective step is illustrated as step 218 in the process flow shown in FIG. 13. In accordance with some embodiments of the present disclosure, gate contact plugs 60 include conductive adhesion/barrier layers 62, and metallic material 64 over adhesion/barrier layers 62. The adhesion/barrier layer 62 may be formed of a material selected from titanium, titanium nitride, tantalum, tantalum nitride, combinations thereof, or multi-layers thereof. Metallic material 64 may be formed of tungsten, copper, aluminum, or alloys thereof, and may be formed using PVD, Metal-Organic Chemical Vapor Deposition (MOCVD) or plating.

In accordance with some embodiments of the present disclosure, dielectric contact spacers 66 are formed to encircle gate contact plugs 60. The material and the formation process of dielectric contact spacers 66 may be similar to the material and the formation process, respectively, of contact spacers 44. In accordance with alternative embodiments, contact spacers 66 are not formed, and hence gate contact plugs are in contact with the sidewalls of ILD 36. Since contact plugs 56 and 60 are located close to each other, the formation of dielectric contact spacers 44 and 66 may eliminate the electrical shorting of contact plugs 56 and 60, which electrical shorting may be caused by the misalignment of contact plugs 56 and/or 60.

Figure 11:
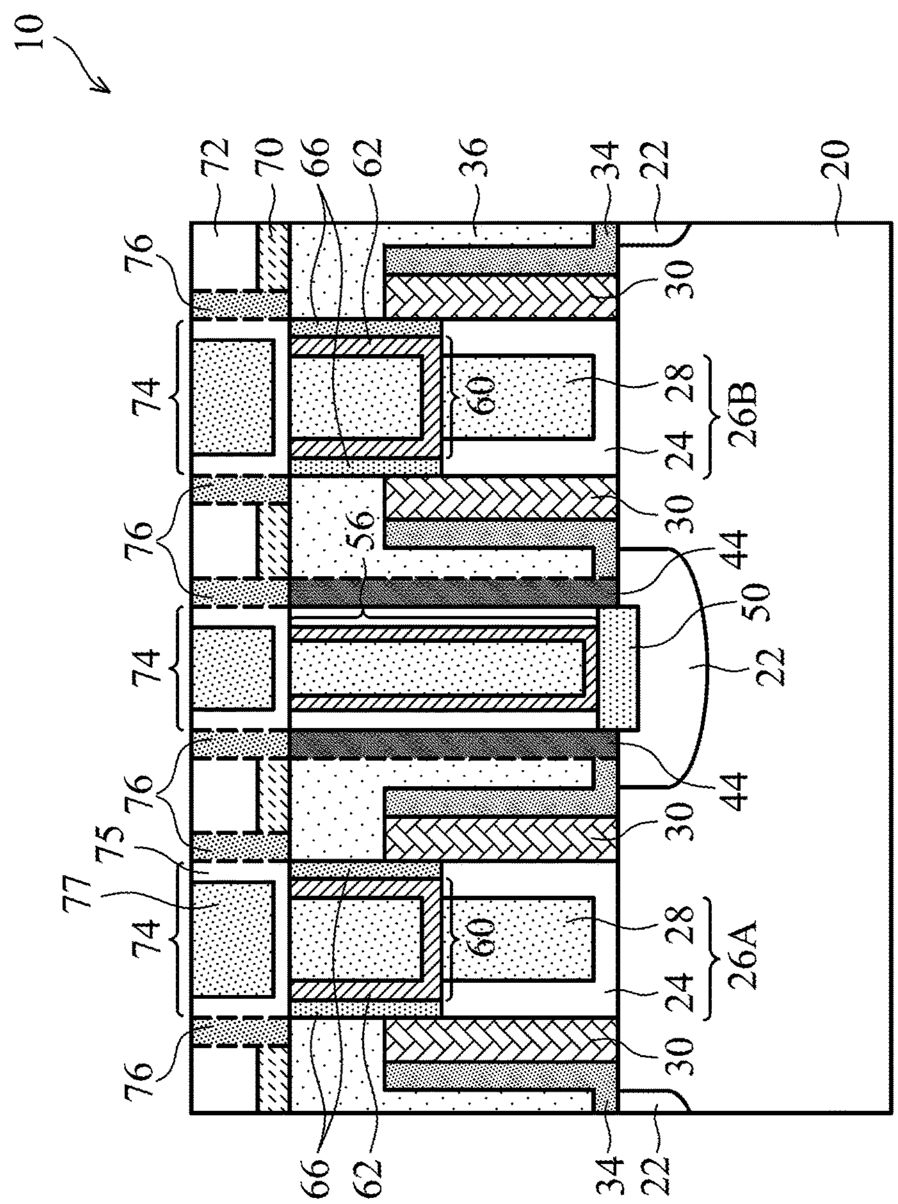

FIG. 11 illustrates the formation of etch stop layer 70, dielectric layer 72, and conductive features 74. The respective step is illustrated as step 220 in the process flow shown in FIG. 13. In accordance with some embodiments of the present disclosure, conductive features 74 are metal lines, and dielectric layer 72 is an Inter-Metal Dielectric (IMD). In accordance with alternative embodiments, conductive features 74 are upper contact plugs, and dielectric layer 72 is an upper ILD (as compared to lower ILD 36). Dielectric contact spacers 76 may be formed to encircle conductive features 74 in accordance with some embodiments. Alternatively, dielectric contact spacers 76 are not formed. Accordingly, dielectric contact spacers 76 are illustrated using dashed lines to indicate that they may be formed or omitted. The formation of contact spacers 44, 66, and 76 may advantageously reduce the possibility of the bridging and the electrical shorting of neighboring contact plugs 56, 60, and 74.

Conductive features 74 may include adhesion/barrier layers 75 and metallic material 77 over adhesion/barrier layers 75. Similarly, adhesion/barrier layers 75 may be metal layers such as titanium layers or tantalum layers or metal nitride layers. In accordance with some embodiments in which adhesion/barrier layers 62 or 75 are formed of metal layers such as titanium layers or tantalum layers, layers 62 and/or 75 may be formed using PVD in a PVD tool, which is essentially the same as the PVD tool shown in FIG. 12, except ratio S1/S2 of the PVD tool for forming layers 62 and/or 75 is smaller than the ratio S1/S2 in the PVD tool for forming metal layer 46. The aspect ratio of opening 58 (FIG. 9) and/or the opening for forming conductive features 74 may be lower than the aspect ratio of opening 40 in FIG. 2. Accordingly, it may be easier to form layers 62 and/or 75 than forming metal layer 46 (FIG. 4). Furthermore, since no silicide will be formed from layers 62 and/or 75, the bottom thicknesses of layers 62 and/or 75 don't need to be significantly greater than the respective sidewall thickness. Accordingly, the PVD tool for forming the layers 62 and/or 75 may have a ratio S1/S2 smaller than 0.02, which ratio may be in the range between about 0.01 and about 0.02.

The embodiments of the present disclosure have some advantageous features. In order to reduce the sizes of transistors, the widths of the contact plugs are also reduced. The reduction in the widths of the contact plugs, however, results in the contact resistance to be increased. In accordance with some embodiments of the present disclosure, the PVD tool for depositing the metal layer used for silicidation (such as a titanium layer) is adjusted, and the process conditions for depositing the metal layer are tuned to increase the bottom thickness of the titanium layer, while keeping the sidewall thickness of the titanium layer not increase proportionally. This advantageously results in the reduction of the contact resistance without causing seams in the contact plugs. In addition, in order to eliminate the electrical shorting of contact plugs, dielectric spacers may be formed. The formation of dielectric spacers, however, causes the further reduction of the size of the source/drain contact opening. This problem is also solved by modifying the PVD tool and adjusting the process conditions of the deposition process.

In accordance with some embodiments of the present disclosure, a method includes forming an ILD with a portion at a same level as a metal gate of a transistor, wherein the ILD and the metal gate are parts of a wafer, and etching the ILD to form a contact opening. A source/drain region of the transistor is exposed through the contact opening. The wafer is placed into a PVD tool. A metal target is in the PVD tool, and the metal target has a first spacing from a magnet over the metal target, and a second spacing from the wafer. A ratio of the first spacing to the second spacing is greater than about 0.02. A metal layer is deposited on the wafer. The metal layer has a bottom portion in the first contact opening, and a sidewall portion in the first contact opening. An anneal is performed to react the bottom portion of the metal layer with the source/drain region to form a silicide region.

In accordance with some embodiments of the present disclosure, a method includes forming an ILD with a portion at a same level as a metal gate of a transistor, wherein the ILD and the metal gate are parts of a wafer, etching the ILD to form a source/drain contact opening, wherein a source/drain region of the transistor is exposed through the source/drain contact opening, and depositing a first titanium layer on the wafer. The first titanium layer has a bottom portion in the source/drain contact opening, and a sidewall portion in the source/drain contact opening. The sidewall portion has a first thickness. An anneal is performed to react the bottom portion of the first titanium layer with the source/drain region to form a silicide region. The silicide region has a second thickness. A ratio of the first thickness to the second thickness is smaller than about 0.35.

In accordance with some embodiments of the present disclosure, a method includes forming an ILD with a portion at a same level as a metal gate of a transistor, wherein the ILD and the metal gate are parts of a wafer, etching the ILD to form a source/drain contact opening, wherein a source/drain region of the transistor is exposed through the source/drain contact opening, and adjusting a PVD tool. A metal target is in the PVD tool, and the metal target has a first spacing from a magnet over the metal target. The method includes increasing the first spacing. A titanium layer is deposited on the wafer in the PVD tool. The titanium layer extends into the source/drain contact opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming an Inter-layer Dielectric (ILD) with a portion at a same level as a metal gate of a transistor, wherein the ILD and the metal gate are parts of a wafer;

etching the ILD to form a first contact opening, wherein a source/drain region of the transistor is exposed through the first contact opening;

placing the wafer into a Physical Vapor Deposition (PVD) tool, wherein a metal target is in the PVD tool, and the metal target has a first spacing from a magnet over the metal target, and a second spacing from the wafer, and a ratio of the first spacing to the second spacing is greater than about 0.02;

depositing a metal layer on the wafer, wherein the metal layer comprises a bottom portion in the first contact opening, and a sidewall portion in the first contact opening;

performing an anneal to react the bottom portion of the metal layer with the source/drain region to form a silicide region; and forming a contact spacer in the first contact opening, wherein the contact spacer encircles a portion of the metal layer.

2. The method of claim 1 further comprising increasing the first spacing to adjust the ratio from smaller than 0.02 to greater than about 0.02.

3. The method of claim 1, wherein the ratio is in a range between about 0.02 and about 0.03.

4. The method of claim 1 further comprising:

forming a first gate spacer and a second gate spacer on opposite sides of the metal gate, wherein the contact spacer, the first gate spacer, and the second gate spacer are separate spacers.

5. The method of claim 1 further comprising forming a capping layer over the metal layer, wherein the anneal is performed with the capping layer covering the metal layer.

6. The method of claim 1, wherein the metal layer has a sidewall portion having a first thickness, and the silicide region has a second thickness, and a ratio of the first thickness to the second thickness is smaller than about 0.35.

7. The method of claim 1, wherein the first contact opening has a width smaller than about 40 nm, and the silicide region has a thickness greater than about 9 nm.

8. The method of claim 1 further comprising:

etching the ILD and a mask layer over the metal gate to form a second contact opening; and forming a gate contact plug and an additional contact spacer in the second contact opening, wherein the additional contact spacer encircles the gate contact plug.

9. A method comprising:

forming an Inter-layer Dielectric (ILD) with a portion at a same level as a metal gate of a transistor, wherein the ILD and the metal gate are parts of a wafer;

etching the ILD to form a source/drain contact opening, wherein a source/drain region of the transistor is exposed through the source/drain contact opening;

depositing a first titanium layer on the wafer, wherein the first titanium layer comprises a bottom portion in the source/drain contact opening, and a sidewall portion in the source/drain contact opening, wherein the sidewall portion has a first thickness, wherein the first titanium layer is deposited through Physical Vapor Deposition (PVD) in a first PVD chamber, wherein a first metal target is in the first PVD chamber, and the first metal target has a first spacing from a first magnet over the first metal target, and a second spacing from the wafer, and a ratio of the first spacing to the second spacing is greater than about 0.02;

performing an anneal to react the bottom portion of the first titanium layer with the source/drain region to form a silicide region, wherein the silicide region has a second thickness, and a ratio of the first thickness to the second thickness is smaller than about 0.35;

forming a dielectric layer over the ILD;

etching the dielectric layer to form an additional contact opening; and depositing a second titanium layer on the wafer, wherein the second titanium layer extends into the additional contact opening, wherein the second titanium layer is deposited in a second PVD chamber, wherein a second metal target is in the second PVD chamber, and the second metal target has a third spacing from a second magnet over the second metal target, and a fourth spacing from the wafer, and a ratio of the third spacing to the fourth spacing is smaller than 0.02.

10. The method of claim 9 further comprising forming a contact spacer in the source/drain contact opening, wherein the contact spacer encircles a portion of the first titanium layer.

11. The method of claim 9, wherein the source/drain contact opening has a width smaller than about 40 nm, and the silicide region has a thickness greater than about 9 nm.

12. The method of claim 9 further comprising forming a capping layer over the first titanium layer, wherein the anneal is performed with the capping layer covering the first titanium layer.

13. The method of claim 9, wherein the first titanium layer has a sidewall portion having a first thickness, and the silicide region has a second thickness, and a ratio of the first thickness to the second thickness is smaller than about 0.35.

14. A method comprising:

forming a gate spacer on a metal gate of a transistor;

forming an Inter-layer Dielectric (ILD) with a portion at a same level as the metal gate, wherein the ILD and the metal gate are parts of a wafer;

etching the ILD to form a source/drain contact opening, wherein a source/drain region of the transistor is exposed through the source/drain contact opening;

forming a contact spacer in the source/drain contact opening;

adjusting a Physical Vapor Deposition (PVD) tool, wherein a metal target is in the PVD tool, and the metal target has a first spacing from a magnet over the metal target, and wherein the adjusting the PVD tool comprises increasing the first spacing; and depositing a titanium layer on the wafer in the PVD tool, wherein the titanium layer extends into the source/drain contact opening.

15. The method of claim 14, wherein the metal target has a second spacing from the wafer, and the first spacing is increased so that a ratio of the first spacing to the second spacing is increased from a value smaller than 0.02 to a value greater than about 0.02.

16. The method of claim 14 further comprising performing an anneal to react a bottom portion of the titanium layer with the source/drain region to form a silicide region.

17. The method of claim 16, wherein the source/drain contact opening has a width smaller than about 40 nm, and the silicide region has a thickness greater than about 9 nm.

18. The method of claim 14 further comprising forming a contact spacer in the source/drain contact opening, wherein the contact spacer encircles a portion of the titanium layer.

19. The method of claim 15 further comprising forming a gate spacer on a sidewall of the metal gate, wherein the gate spacer and the contact spacer are separated from each other by a portion of the ILD.

20. The method of claim 19, wherein a portion of the titanium layer is in the source/drain contact opening and is encircled by the contact spacer.

* * * * *